United States Patent [19]

Bergemont

[11] Patent Number: 5,225,362
[45] Date of Patent: Jul. 6, 1993

[54] METHOD OF MANUFACTURING A FULL FEATURE HIGH DENSITY EEPROM CELL WITH POLY TUNNEL SPACER

[75] Inventor: Albert Bergemont, Santa Clara, Calif.

[73] Assignee: National Semiconductor Corporation, Santa Clara, Calif.

[21] Appl. No.: 891,710

[22] Filed: Jun. 1, 1992

[51] Int. Cl.[5] .......................................... H01L 21/266
[52] U.S. Cl. ..................................... 437/43; 437/193; 437/979
[58] Field of Search ...................... 437/43, 44, 49, 193, 437/195, 978, 979; 148/DIG. 43, DIG. 163

[56] References Cited

U.S. PATENT DOCUMENTS

| 4,924,437 | 5/1990 | Paterson et al. | 437/43 |
| 5,021,848 | 6/1991 | Chiu | 437/43 |
| 5,108,939 | 4/1992 | Manley et al. | 437/43 |
| 5,156,991 | 10/1992 | Gill et al. | 437/979 |

Primary Examiner—Brian E. Hearn
Assistant Examiner—C. Chaudhari
Attorney, Agent, or Firm—Limbach & Limbach

[57] ABSTRACT

An electrically erasable programmable read only memory (EEPROM) cell is fabricated by forming first and second first field oxide (FOX1) regions in a P-well in an N-substrate to define a P-type active device region. First and second buried N+ bit lines are formed in the P-well adjacent to the FOX1 regions; bit lines define a P-type channel region therebetween. First and second second field oxide (FOX2) regions are formed adjacent to the FOX1 regions and overlying the buried N+ bit-lines. A layer of gate oxide 300-500Å thick is formed on the P-well between the FOX2 regions. A layer of polysilicon is formed over the gate oxide to extend over only a first portion of the P-type channel region. A tunnel window is defined on the gate oxide over the P-type channel region and overlapping the floating gate edge. The gate oxide is removed from the tunnel window and tunnel oxide about 80-100Å thick is formed. A spacer/contact window is defined over the field oxide and overlapping the floating gate edge on the field oxide. The edge oxide grown on the floating gate during tunnel oxide growth is removed from the spacer/contact window. A polysilicon tunnel spacer is formed over the tunnel oxide and in electrical contact with the floating gate at the spacer/contact window, i.e. at the floating gate edge over field oxide. Oxide is removed from the top of the floating gate plate and substrate over the channel region and adjacent to the floating gate. Then ONO is grown over the floating gate, the poly tunnel spacer and the exposed channel region adjacent the floating gate. Finally, a second layer polysilicon is formed over the ONO to define a control gate of the EEPROM cell.

7 Claims, 6 Drawing Sheets

METHOD OF MANUFACTURING A FULL FEATURE HIGH DENSITY EEPROM CELL WITH POLY TUNNEL SPACER

RELATED APPLICATIONS

This application is related to the following two applications which are commonly assigned with this application to National Semiconductor Corporation and are both filed of even date herewith: (1) U.S. patent application Ser. No. 07/891,705, filed by Albert Bergemont for HIGH DENSITY EEPROM CELL WITH NOVEL PROGRAMMING SCHEME AND METHOD OF MANUFACTURE and (2) U.S. patent application Ser. No. 07/891,764, filed by Michael Hart et al. for HIGH DENSITY EEPROM CELL WITH TUNNEL OXIDE STRIPE. Both of the aforementioned related applications are hereby incorporated by reference to provide additional background information regarding the present invention.

BACKGROUND OF THE INVENTION

1. FIELD OF THE INVENTION

The present invention relates to a high density electrically erasable programmable read only memory (EEPROM) devices and, in particular, to a high density EEPROM cell that is fabricated over a P-well and utilizes a polysilicon floating gate spacer to facilitate Fowler-Nordheim tunneling for programming and erase.

2. DISCUSSION OF THE PRIOR ART

The basic, fundamental challenge in creating an electrically erasable programmable read only memory (EEPROM) cell is to use a controllable and reproducible electrical effect which has enough nonlinearity so that the memory cell can be written or erased at one voltage in less than 1ms and can be read at another voltage, without any change in the programmed data for more than 10 years. Fowler-Nordheim tunneling, which was first described by Fowler and Nordheim in 1928, exhibits the required nonlinearity and has been widely used in EEPROM memories.

In silicon (Si), the energy difference between the conduction band and the valence band is 1.1 eV. In silicon dioxide ($SiO_2$), the energy difference between these bands is about 8.1 eV, with the conduction band in $SiO_2$ 3.2 eV above that in Si. Since electron energy is about 0.025 eV at thermal room temperature, the probability that an electron in Si can gain enough thermal energy to surmount the Si-to-$SiO_2$ barrier and enter the conduction band in $SiO_2$ is very small. If electrons are placed on a polysilicon floating gate surrounded by $SiO_2$, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si-$SiO_2$ interface, the energy bands will be distorted and there is a small, but finite, probability that an electron in the conduction band of the Si will quantum mechanically tunnel through the energy barrier and emerge in the conduction band of the $SiO_2$.

The tunneling current increases exponentially with the applied field in accordance with the following general current density expression:

$$J = (AE2) \exp(-B/E)$$

where
A and B are constants, and
E is the field at the Si-SiO2 interface

This current is observable at a current density of 10E-6 A/cm2 when the field at the Si-$SiO_2$ interface is about 10 MV/cm. Local fields of this magnitude, at voltages practicable for use in microelectronics, can be obtained by applying a voltage across either a thin (about 100Å) oxide grown on bulk silicon or across thicker (about 500Å) oxide grown on polysilicon. In the latter case, the field enhancement arises from textured polysilicon formation, i.e. positive curvature regions at the polysilicon-polysilicon oxide interface resulting in tunneling enhancement at similar voltages as in the first case.

The theoretically ideal EEPROM memory cell comprises a single transistor addressable by applying electrical signals to a specified row and a specified column of the memory array matrix. For example, to write a logic "1" or a logic "0" into a cell of this "ideal" memory, a voltage is applied to the control gate corresponding to the row (word line) of the selected memory cell while a voltage corresponding to either a logic "1" or a "0" is applied to the source or drain corresponding to the column (bit line) of the selected cell.

An important problem encountered in the realization of this "ideal" cell is the need to provide an additional distinct access transistor in each memory cell in order to enable selection of a single row of memory cells while changing data in the selected cell without accidentally writing or erasing memory in other rows. Unfortunately, the presence of an additional access transistor in each memory cell increases the size of the cell and leads to impractical die size for high density Megabit memory arrays.

It is, therefore, a goal to provide an EEPROM cell which does not require a distinct access transistor in each memory cell to provide reliable selection of a single cell for changing data while precluding accidental simultaneous programming or erasure in non-selected cells.

Figure 1:
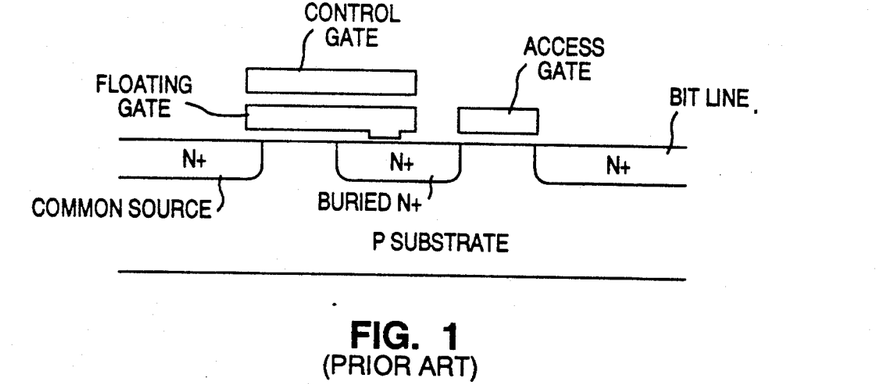
FIG. 1 is a cross-section drawing illustrating a conventional EEPROM cell structure that utilizes a distinct access transistor.

The basic concept of the well-known FLOTOX EEPROM memory cell is shown in FIG. 1. In the FLOTOX cell, the tunnel dielectric, which typically is less than 100Å thick, is grown over an area defined photolithographically in the drain region (or an extension of the drain region, called buried N+). Charging of the floating gate to program the cell is achieved by grounding the source and the drain and applying a high voltage to the control gate. The cell is designed such that a large fraction of the applied voltage is coupled across the tunnel oxide, resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from the $\leq$ 5V supply.

If a single transistor memory cell is placed in a typical array with drains connected to metal columns and gates connected to common polysilicon word lines, the erasing of a cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1, the FLOTOX cell utilizes a distinct access transistor to isolate the drain from the column bit line. The access transistor is off for rows that are not selected.

Figure 2:
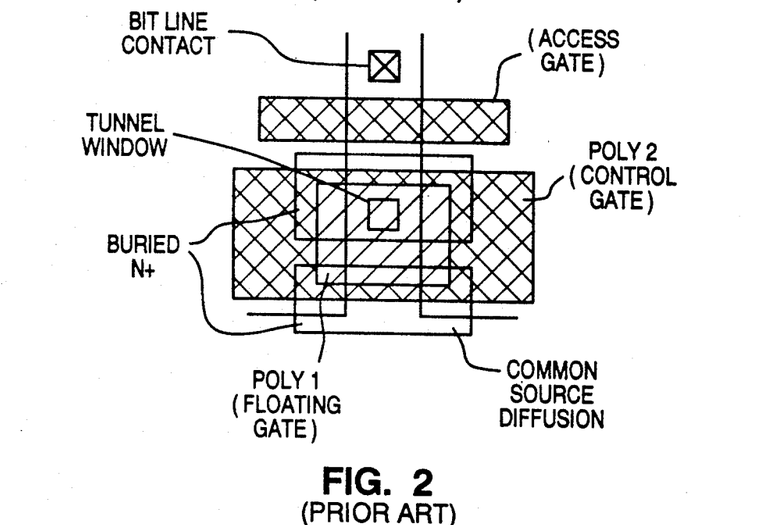
FIG. 2 is a layout illustrating the FIG. 1 cell structure.

FIG. 2 provides a layout of the FIG. 1 FLOTOX cell, with the FIG. 1 cross section being taken perpendicular to the word line (control gate) and through the tunnel oxide window.

Figure 3:
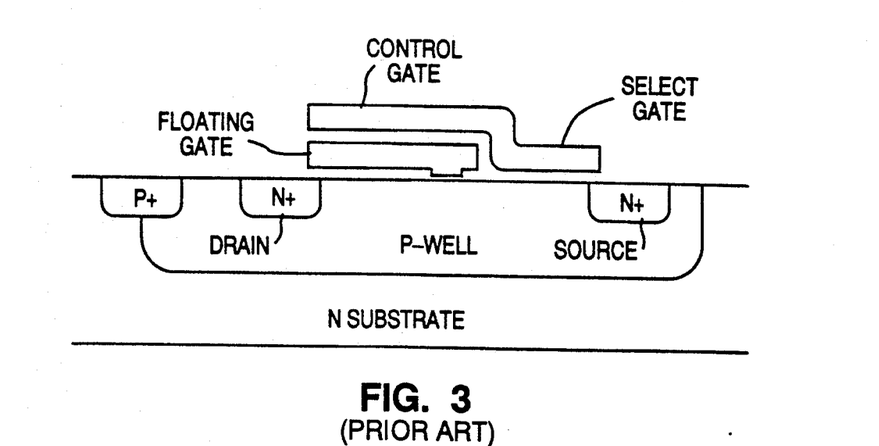
FIG. 3 is a cross-section drawing illustrating a prior art EEPROM cell that is fabricated on a P-well and utilizes an internal access transistor.

E.K. Shelton, "Low-power EE-PROM can be reprogrammed fast", Electronics, Jul 31, 1980, pp. 89–92, discloses a basic EEPROM concept similar to the above-described FLOTOX concept. However, as shown in FIG. 3, instead of a tunnel oxide area defined lithographically over the drain (buried N+), the Shelton cell has its tunnelling area defined in the channel under the polysilicon floating gate. The polysilicon floating gate partially spans the drain side of the channel, while the remainder of the channel (source side) is spanned by an overlying aluminum control gate. The aluminum control gate is insulated from the polysilicon floating gate by a thin silicon nitride layer.

Furthermore, the Shelton memory cell is formed in a P-well on a N-substrate. Controlling the P-well potential allows the elimination of the distinct access transistor in each memory cell. The potential of the P-well and the sources and drains of the unselected cells are chosen during programming operations to prevent minority carriers from discharging any of the floating gates to the substrate while permitting an individual selected floating gate to be programmed.

Programming of the FIG. 3 cell is achieved by grounding the P-well and connecting the drain of the memory cell through a load resistance to the programming voltage. The source is connected to either the programming voltage or to ground depending upon whether a "1" or a "0" is to be stored. To initiate programming, the aluminum control gate is connected to the high voltage. If the source potential is also connected to the high voltage, then the internal access transistor doesn't turn on and the surface of the P-well below the floating gate is depleted of electrons. Only a small potential difference exists between the surface of the P-well and the floating gate. Therefore, no electrons tunnel into the gate and the cell remains in a 0 state. If the source terminal is connected to ground (to program a 1), then the internal access transistor turns on, the surface potential under the floating gate drops to close to 0V, and electrons from the inversion layer tunnel through the thin oxide into the floating gate.

The FIG. 3 cell is erased by grounding the control gate and then raising the P-well to the programming voltage. This causes electrons to tunnel from the floating gate oxide to the P-well via the tunnel oxide. As electrons tunnel through the tunnel oxide, the floating gate acquires a net positive charge.

Although the FIG. 3 Shelton cell differs from the FLOTOX cell in that it does not utilize a separate access transistor, it does require an internal access transistor and, thus, requires a relatively large cell size.

Related U.S. patent application Ser. No. 07/891,705 for HIGH DENSITY EEPROM CELL WITH NOVEL PROGRAMMING SCHEME AND METHOD OF MANUFACTURE, referenced above, discloses an EEPROM cell that reduces cell size by eliminating the internal access transistor and by forming the buried N+ bit lines under field oxide to shorten the channel length. Although this cell provides a significant improvement over prior art EEPROM cells, it utilizes conventional techniques for defining the cell's tunnel oxide. These conventional techniques inhibit further cell size reduction.

SUMMARY OF THE INVENTION

A preferred embodiment of the present invention provides an electrically erasable programmable read only memory (EEPROM) cell that is fabricated by first forming first and second first field oxide (FOX1) regions in a P-well in an N-substrate to define a P-type active device region therebetween. Next, first and second buried N+ bit lines are formed in the P-well adjacent to the first and second FOX1 regions, respectively, such that the first and second N+ bit lines define a P-type channel region therebetween. First and second second field oxide (FOX2) regions are then formed adjacent to the first and second FOX1 regions, respectively, and overlying the first and second buried N+ bit lines, respectively. Next, a layer of gate oxide about 300–500Å thick is formed on the P-well between the first and second FOX2 regions. A layer of polysilicon is then formed over the gate oxide to extend over only a first portion of the P-type channel region. A tunnel window is then defined in the gate oxide over the P-type channel region and overlapping the edge of the floating gate. The gate oxide is removed from this window and tunnel oxide about 80–100Å thick is grown in the window. A spacer/contact window is then defined over the field oxide and overlapping the edge of the floating gate formed on the field oxide. The oxide grown on the edge of the poly1 floating gate during tunnel oxide growth is removed from this second window. A polysilicon tunnel spacer is then formed over the tunnel oxide and around the perimeter of the floating gate to be in electrical contact with the floating gate at the second window, i.e. at the edge of the floating gate over field oxide. Next, oxide is removed from the top of the poly1 floating gate plate and from the substrate over the channel region and adjacent to the floating gate. Then, ONO is grown over the floating gate, the poly tunnel spacer, and the exposed channel region adjacent the floating gate. Finally, a second layer of polysilicon and overlying tungsten silicide is formed over the ONO to define a control gate of the EEPROM cell such that the second layer of polysilicon is formed directly on the ONO overlying the second portion of the channel region to thereby define the gate of an internal access transistor of the EEPROM cell.

A better understanding of the features and advantages the present invention will be obtained by reference to the following detailed description of the invention and accompanying drawings which set forth an illustrative embodiment in which the principals of the invention are utilized.

DETAILED DESCRIPTION OF THE INVENTION

Figure 4:
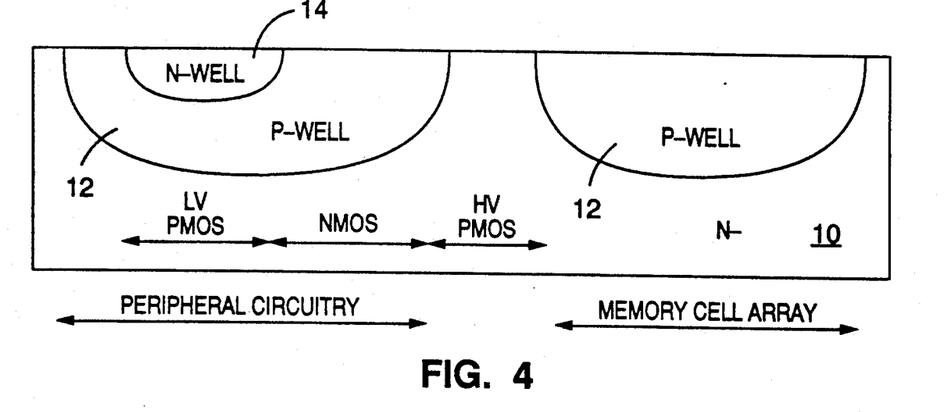
FIG. 4 is a cross-section drawing illustrating a triple-well structure utilizable in the fabrication of an EEPROM cell array in accordance with the present invention.

FIGS. 4-12 illustrate the steps for fabricating an EEPROM cell in accordance with the present invention. Referring to FIG. 4, the fabrication process begins with a silicon substrate 10 of N-type conductivity. In a conventional front-end process step, an initial oxide layer (not shown) is grown over the substrate 10. A photoresist mask is then formed over the initial oxide layer and patterned to define selected surface areas of the N-type substrate 10. These surface areas are then implanted with a P-type dopant to form P-well regions 12 in the substrate 10. The photoresist mask is then stripped from the surface of the oxide and a thermal drive-in step is performed to further define the P-well regions 12.

The initial oxide layer is then removed from the substrate 10 and a second oxide layer (not shown) is grown over the substrate 10. The substrate 10 is again masked with photoresist, which is patterned to define substrate surface areas within those P-well regions 12 which will ultimately contain the peripheral circuitry for the EEPROM memory cell array. N-type dopant is implanted into the periphery P-wells 12 to define N-well regions 14. The photoresist is then stripped and a further drive-in step for both the N-well regions 14 and the P-well regions 12 is performed. Following the drive-in step, the second oxide layer is removed, resulting in the structure shown in FIG. 4.

Thus, the initial processing steps result in the formation of a triple-well structure which defines the substrate 10 for the formation of the EEPROM memory cell array and its peripheral circuitry. The N-well regions 14 in the periphery will be utilized for the fabrication of low voltage (LV) PMOS devices. The P-well regions 12 in the periphery will be utilized for the formation of NMOS devices for the peripheral circuitry. The P-well regions 12 in the memory cell array portion of the substrate 10 will be utilized for formation of EEPROM storage cell devices. The intermediate substrate region will be used for the formation of high voltage (HV) PMOS devices.

Figure 5:
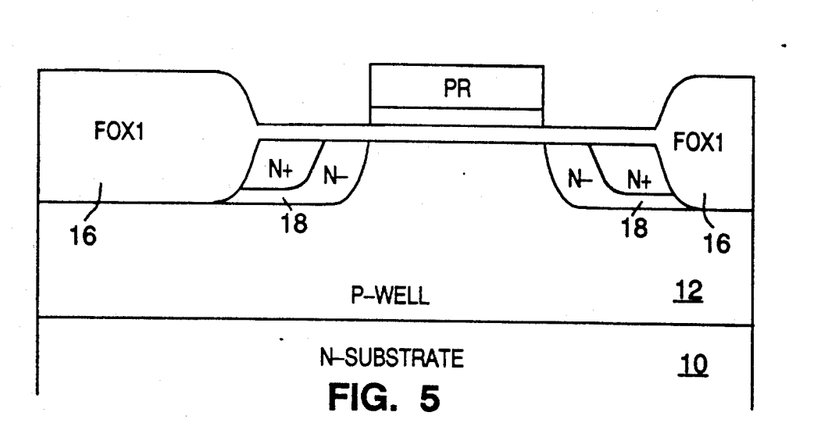
FIG. 5 is a cross section drawing illustrating a stage in the fabrication of an EEPROM cell in accordance with the present invention after definition of the cell's N+/N− bit lines.

Referring now to FIG. 5, after formation of the triple-well structure described above, conventional process techniques are utilized to define regions in the substrate 10 for formation of field oxide. That is, a pad oxide is first grown on the surface of the substrate 10, followed by deposition of an overlying nitride layer. The pad oxide/nitride composite is masked with photoresist, which is then patterned to expose regions of underlying nitride which will ultimately define first field oxide (FOX1) regions. The nitride is then etched, the photoresist is stripped and a P-type field implant is performed through the exposed pad oxide regions. The field implant mask is then stripped and first field oxide regions (FOX1) 16 are formed, as shown in FIG. 5.

Next, as further shown in FIG. 5, portions of the P-well regions 12 in the memory cell array are masked, the nitride/oxide composite is etched, and an arsenic implant is performed to define N+ buried bit lines 18 adjacent the FOX1 field oxide regions 16. Optionally, the arsenic implant can be followed by a phosphorous implant to form graded N+/N− bit lines 18, thereby optimizing resistance to avalanche breakdown during the erase of the EEPROM cells.

Figure 6:
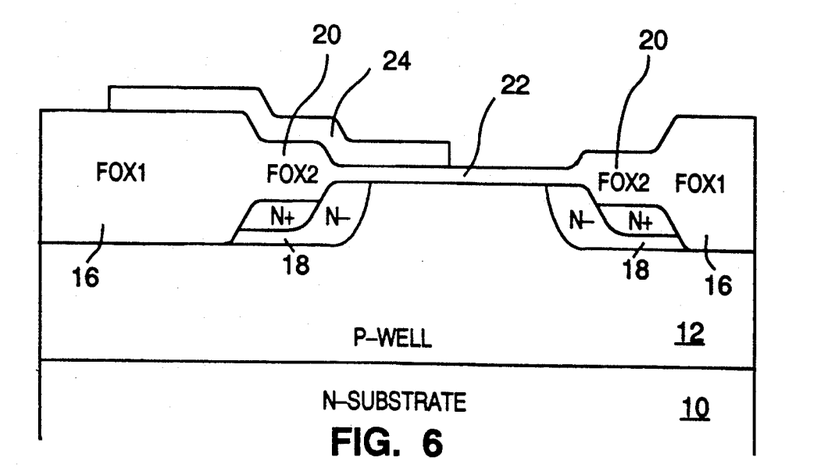
FIG. 6 is a cross section drawing illustrating a stage in the fabrication of an EEPROM cell in accordance with the present invention after definition of the cell's floating gate.

As shown in FIG. 6, the photoresist is then stripped and field oxide growth is completed by formation of second field oxide regions (FOX2) 20 over the N+/N− bit lines 18. Since the bit lines 18 are formed under the field oxide (FOX1/FOX2) 16/20, the size of the device active region can be reduced, resulting in a reduced array size.

After completion of the field oxide growth, i.e. formation of FOX1 regions 16 and FOX2 regions 20, the oxide/nitride/oxide (ONO) layer is removed and a sacrificial oxide layer (not shown) is formed. A threshold voltage mask is then formed and patterned to expose the channel regions of the N-channel devices of the array. A threshold implant is then performed to characterize the threshold voltage of the storage cell transistors and the photoresist mask is stripped. Then the sacrificial oxide is removed.

Next, a gate oxide layer 22 about 300-500Å thick is grown over the exposed portions of P-well region 12. A first layer of polysilicon is then deposited on the underlying gate oxide 22 to a thickness of about 1500Å and doped with phosphorous. The polysilicon (poly1) is then etched to define the floating gates 24 of the EEPROM cells of the array. As shown in FIG. 6, the poly1 floating gate 24 is etched such that it extends from the field oxide 16/20 over only a portion of the P-type channel region.

Figure 7:
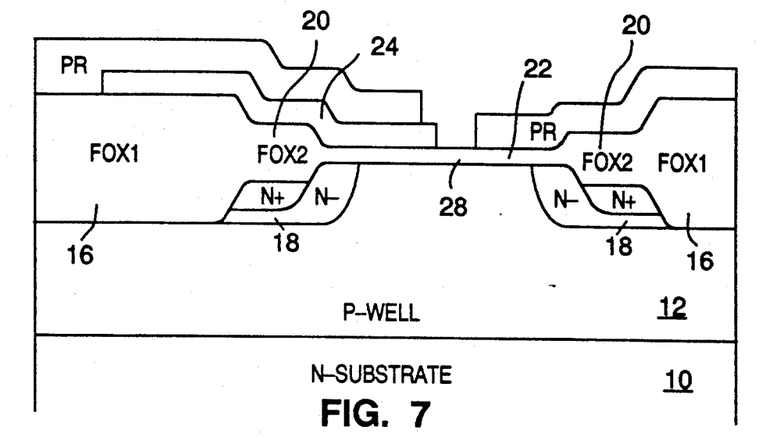
FIG. 7 is a cross-section drawing illustrating a stage in the fabrication of an EEPROM cell in accordance with the present invention after definition of the tunnel window mask.
Figure 8:
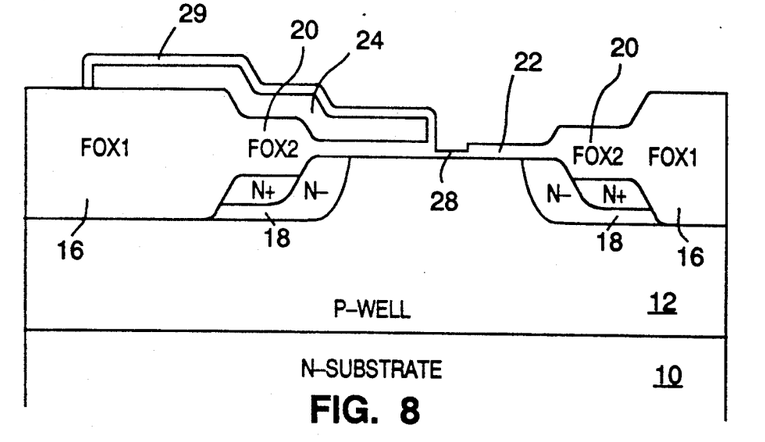
FIG. 8 is a cross-section drawing illustrating a stage in the fabrication of an EEPROM cell in accordance with the present invention after growth of the cell's tunnel oxide.

Next, as shown in FIG. 7, a tunnel window mask is formed over the gate oxide 22 and the floating gate 24 to define a tunnel window 26 that overlaps the edge of the floating gate 24 over the channel. The gate oxide in the tunnel window 26 is then etched through to the surface of the P-well 12. After the tunnel mask is stripped, tunnel oxide 28 about 80–100Å thick is grown in the tunnel window. This oxidation step also results in the growth of oxide 29 on both the sidewalls and the top of the poly1 floating gate 24. The structure at this step of the process is shown in FIG. 8.

Figure 9:
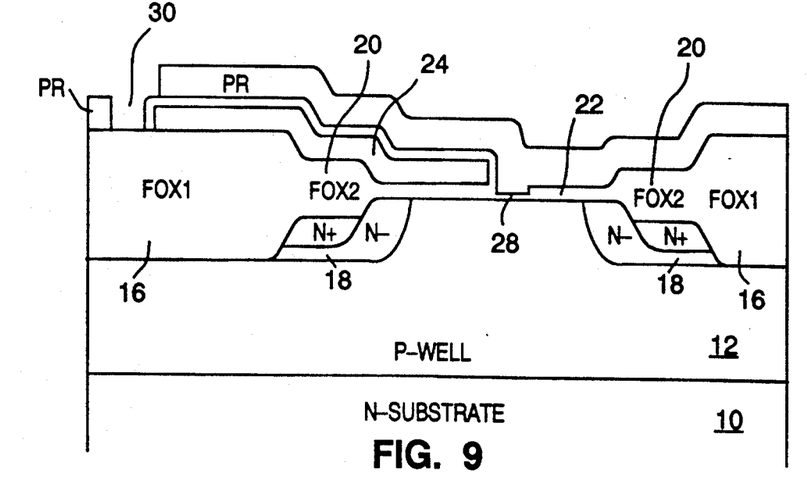
FIG. 9 is a cross section drawing illustrating a stage in the fabrication of an EEPROM cell in accordance with the present invention after definition of the cell's spacer/contact mask.

Referring to FIG. 9, next, a spacer/contact window 30 is defined at the opposite edge of the floating gate 24, i.e. the edge of the floating gate 24 over field oxide. The spacer/contact window 30 overlaps the floating gate 24 to provide a region by which a to-be-formed polysilicon spacer will be in electrical contact with the poly1 floating gate 24.

Figure 10:
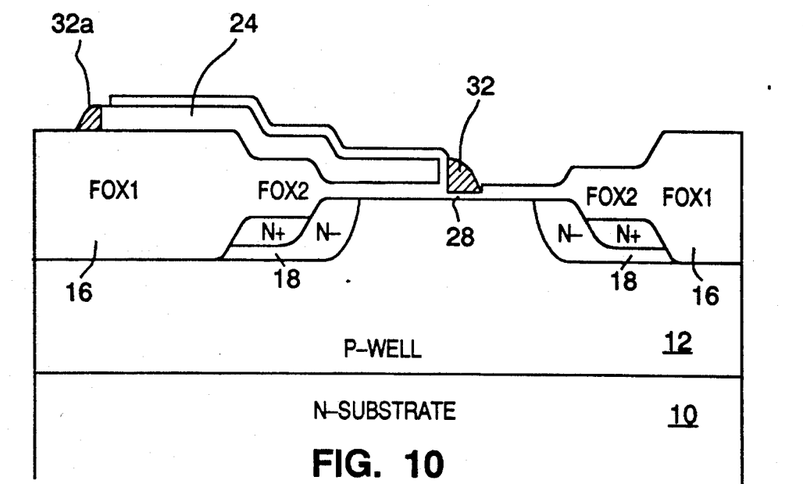
FIG. 10 is a cross-section drawing illustrating a stage in the fabrication of an EEPROM cell in accordance with the present invention after formation of the poly cell's tunnel spacer.

After the edge oxide grown on the poly1 floating gate 24 during tunnel oxide growth is removed from the spacer/contact window 30, the spacer mask is stripped and a layer of polysilicon is deposited. This layer of polysilicon is then etched back to define a poly tunnel spacer 32 that overlies the tunnel oxide 28 and extends around the perimeter of the floating gate 24 to contact the poly1 floating gate 24 over the field oxide (FOX-1/FOX2) 16/20. The structure at this stage in the process is shown in FIG. 10.

Figure 11:
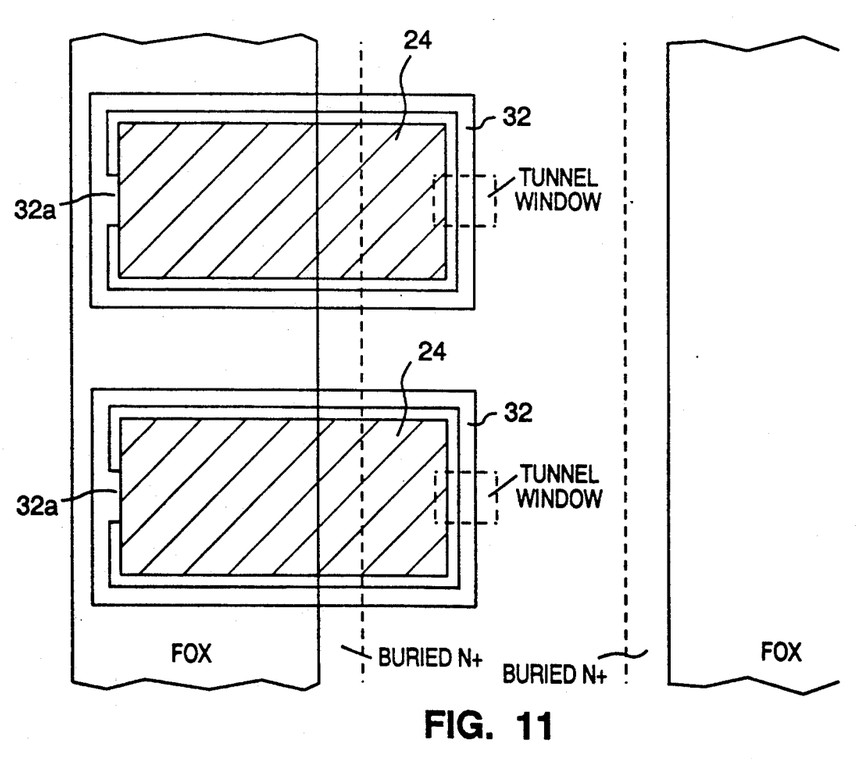
FIG. 11 is a layout illustrating the FIG. 10 cell structure.

As best shown in FIG. 11, the poly tunnel spacer 32 is separated from the floating gate 24 by edge oxide except at the spacer contact region 32a.

Formation of the tunnel oxide 28 and poly floating gate/spacer combination in this way permits improved process control over the length of extension of the floating gate over the P-type channel region, thereby allowing the channel length and, hence, array size to be reduced.

After oxide is removed from the top of the floating gate 24 and from the channel region adjacent the floating gate 24, a layer 33 of oxide/nitride/oxide composite is then grown over the floating gate 24, the poly tunnel spacer 32 and the exposed portion 35a of the channel region 35 to provide insulation from a subsequently-formed polysilicon word line.

Next, a protect array mask is formed over the memory cell array portion of the substrate 10 and device formation in the periphery proceeds.

First, oxide is etched from the substrate active device regions in the periphery and gate oxide is grown on the active device regions. A threshold mask is then formed and a P-type implant is performed to set the threshold of the peripheral PMOS devices. The threshold photoresist mask is then stripped and processing begins to form both the word lines for the memory cell array and the gates for the MOS devices in the periphery.

That is, a second layer of polysilicon is deposited over the surface of the entire device and doped in the conventional manner. This is followed by deposition of an overlying layer of tungsten silicide. The poly2/tungsten silicide composite is then masked and etched to define the word lines 34 in the storage cell array and the gate electrodes of the peripheral MOS devices. The word lines 34 run parallel to and overly the ONO/poly1 lines in the array.

The remaining photoresist is then stripped from the device and sidewall oxidation is performed on the devices in the peripheral region.

From this point, the process flow proceeds according to standard CMOS processing techniques with extra masks utilized for forming the high voltage PMOS transistors in the N- substrate 10 between the periphery and the storage cell array. The resulting cell structure is shown in FIG. 12.

Figure 12:
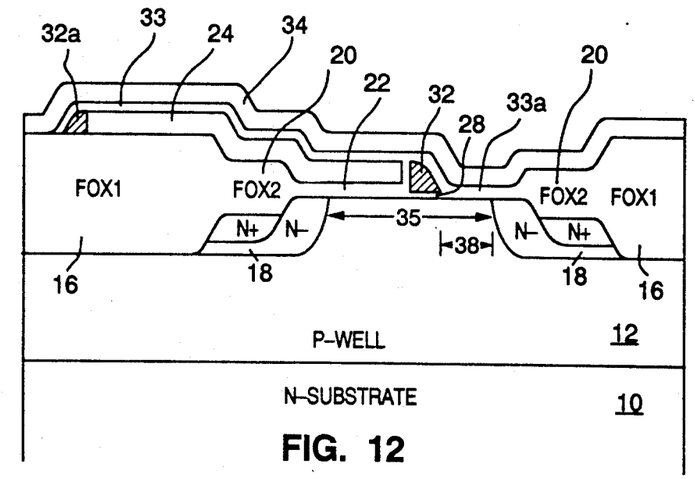
FIG. 12 is a cross section drawing of an EEPROM cell in accordance with the present invention after formation of the cell's word line.
Figure 13:
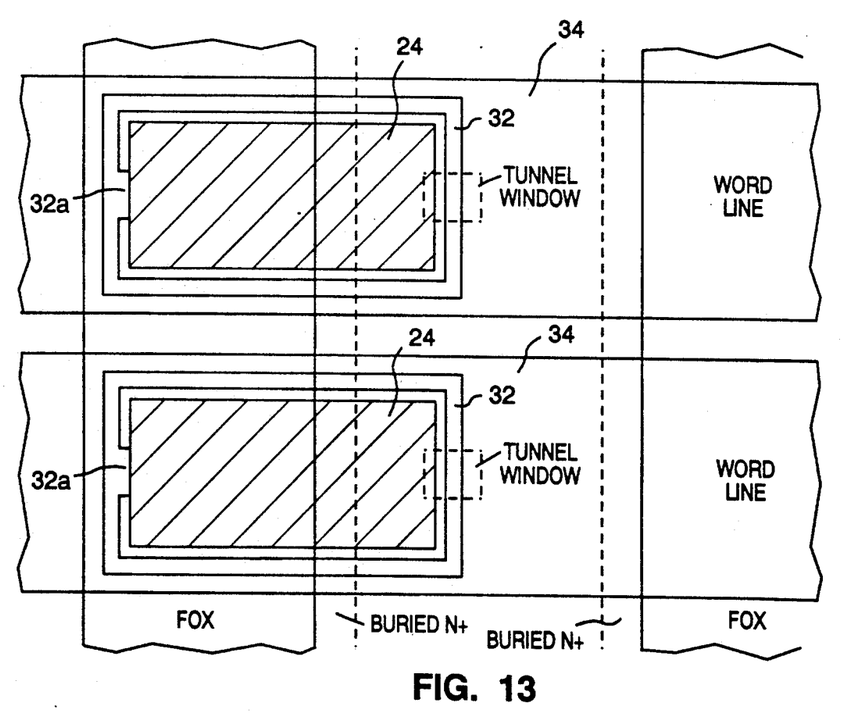
FIG. 13 is a layout illustrating the FIG. 12 cell structure.

A corresponding layout of the FIG. 12 cell is shown in FIG. 13, with the FIG. 12 cross section being taken along a word line 34 in the FIG. 13 layout.

Referring back to FIG. 12, as stated above, the EEPROM memory cell utilizes a poly1 floating gate plate 24 which is truncated with an edge over the P-well channel region between N+ buried bit lines 18. Thus, the overlying poly2 word line 34 forms the gate 36 of an internal access transistor in a manner similar to the Shelton cell described above. However, because of the advantages provided by the processing techniques described above, in particular, the implementation of a poly spacer to reduce channel length, the FIG. 7 cell is smaller than the Shelton cell. At the same time, the internal access transistor prevents over-erase in the array.

Figure 14:
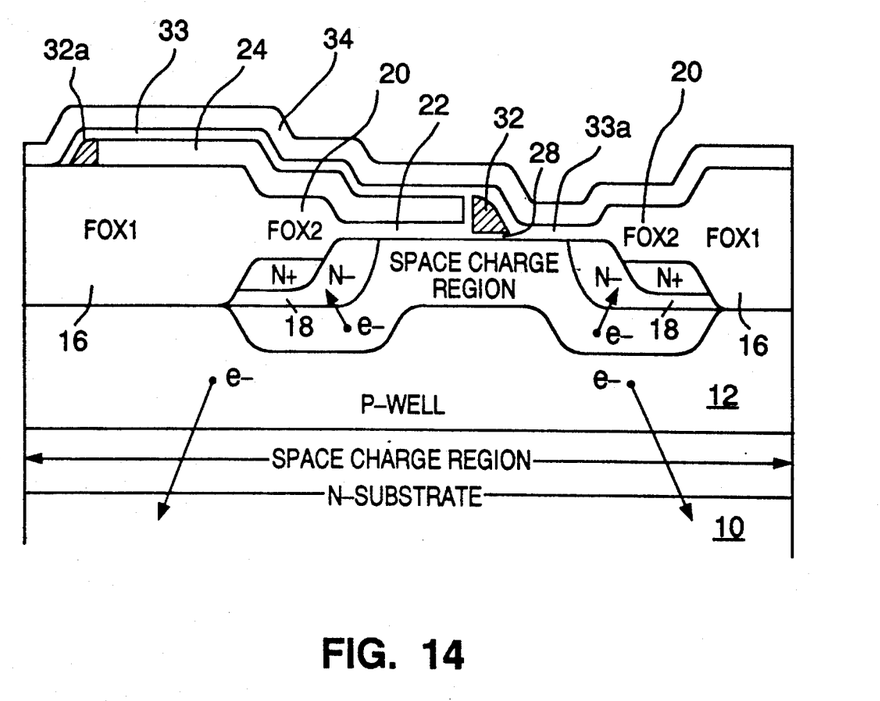
FIG. 14 is a cross-section drawing illustrating inhibit conditions in the FIG. 12/13 cell during programming.

Table 1 provides a programming scheme for the FIG. 12/13 cell. In accordance with the present invention, and as shown in FIG. 14, the Table I programming scheme addresses deep depletion during programming by causing any minority carriers (i.e. electrons) thermally generated in the P-well or in the space charge regions to be "sucked up" by the N-/P-well and the bit line/P-well reversed bias junctions.

TABLE 1

| | Source | Drain | Control Gate | P-Well | N-Sub |
|---|---|---|---|---|---|
| Write | $V_{ss}$ | $V_{ss}$ | $V_{pp}$ | $V_{ss}$ | $V_{pp}$ |
| WL Write Inhibit | $V_{pp}$ | $V_{pp}$ | $V_{pp}$ | $V_{ss}$ | $V_{pp}$ |
| BL Write Inhibit | $V_{ss}$ | $V_{ss}$ | $V_{ss}$ | $V_{ss}$ | $V_{pp}$ |
| Erase | $V_{pp}$ | $V_{pp}$ | $V_{ss}$ | $V_{pp}$ | $V_{pp}$ |
| BL Erase Inhibit | $V_{pp}$ | $V_{pp}$ | $V_{pp}$ | $V_{pp}$ | $V_{pp}$ |
| Read | $V_{ss}$ | $V_{read}$ | $V_{cc}$ | $V_{ss}$ | $V_{cc}$ |

Figure 15:
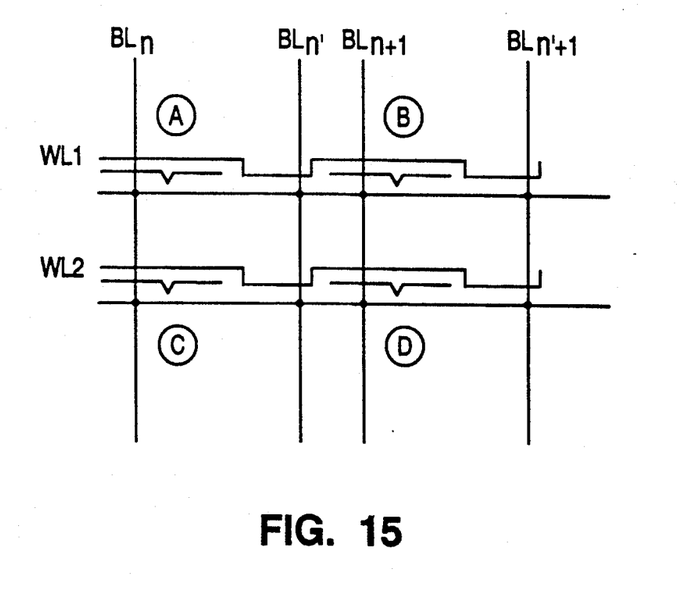
FIG. 15 is a schematic diagram illustrating a portion of a high density EEPROM cell array in accordance with the present invention.

More specifically, with reference to FIG. 15, the programming conditions are as follows. To program cell A, word line WL1 is held at the programming voltage $V_{pp}$. Bit line $BL_n$ and bit line $LB_{n1}$ are held at the low supply voltage $V_{ss}$. The P-well is also held at $V_{ss}$. This creates an inversion layer of minority carriers in the channel, causing electrons to tunnel to the floating gate.

During this operation, cell C is program-inhibited by holding word line WL2 at $V_{ss}$, bit line $BL_n$ and $BL_{n1}$ at $V_{ss}$ and the P-well at $V_{ss}$. Furthermore, cell B is program inhibited by holding wordline WL1 at $V_{pp}$ and raising bit line $BL_{n+1}$ and $BL_{n'+1}$ to the programming voltage, while the P-well is held at $V_{ss}$. This avoids the occurrence of any minority carriers at the P-well surface under the floating gate; the only minority carrier generation is thermal and all of these electrons are evacuated from the P-well by the source and drain and the reverse bias junction.

With continuing reference to FIG. 12, the erase conditions for the above-described storage cell are as follows. To erase cell A and its associated byte or word line, word line 1 is held at $V_{ss}$ while bit lines $B_{Ln}$ and $B_{Ln'}$ and $B_{Ln+1}$ and $B_{:m'+1}$, as well as the P-well are held at the programming voltage $V_{pp}$. During this operation, cells C and D are erase inhibited by holding word line WL2 at the programming voltage.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of fabricating an electrically-erasable programmable read only memory (EEPROM) cell in semiconductor material of P-type conductivity the method comprising:

(a) forming first and second spaced-apart first field oxide (FOX1) regions in the P-type semiconductor material to define a P-type active device region therebetween;

(b) forming first and second spaced-apart bit lines of N-type conductivity in the P-type semiconductor material adjacent to the first and second FOX1 regions, respectively, such that the first and second bit lines define a P-type channel region therebetween;

(c) forming first and second spaced-apart second field oxide (FOX2) regions adjacent to the first and second FOX1 regions, respectively, and overlying the first and second bit lines, respectively;

(d) forming a layer of gate dielectric material on the P-type semiconductor material between the first and second FOX2 regions;

(e) forming a layer of first conductive material over the gate dielectric material to define a floating gate of the EEPROM cell wherein the layer of first conductive material is formed to extend over only a first portion of the P-type channel region;

(f) defining tunnel dielectric material in the gate dielectric material over the P-type channel region such that the thickness of the tunnel dielectric material is less than the thickness of the gate dielectric material;

(g) forming a tunnel spacer of first conductive material over the tunnel dielectric and in electrical contact with the floating gate;

(h) forming a layer of intermediate dielectric material over the floating gate; and (i) forming a layer of second conductive material over the layer of intermediate dielectric material to define a control gate of the EEPROM cell such that the layer of second conductive material is formed directly on intermediate dielectric material overlying a second portion of the channel region to thereby define the gate of an internal access transistor of the EEPROM cell.

2. A method as in claim 1 wherein the tunnel dielectric material and the gate dielectric material comprise silicon dioxide.

3. A method as in claim 2 wherein the first conductive material comprises polysilicon.

4. A method as in claim 3 wherein the intermediate dielectric material comprises an oxide/nitride/oxide composite.

5. A method as in claim 4 wherein the second conductive material comprises polysilicon.

6. A method as in claim 5 wherein the second conductive material comprises polysilicon and overlying tungsten silicide.

7. A method as in claim 1 wherein the P-type semiconductor material comprises a well of P-type conductivity formed in a silicon substrate of N-type conductivity.

* * * * *